US006801045B2

(12) United States Patent
Hamm et al.

(10) Patent No.: US 6,801,045 B2
(45) Date of Patent: Oct. 5, 2004

(54) METHOD AND DEVICE FOR CHECKING AN OPERATING PARAMETER OF AN ELECTRIC FENCE

(75) Inventors: Valery Hamm, La Fleche (FR); Yves Mulet-Marquis, La Meignanne (FR)

(73) Assignee: LACME, La Garenne Colombes (FR)

( * ) Notice: Subject to any disclaimer, the term of this patent is extended or adjusted under 35 U.S.C. 154(b) by 0 days.

(21) Appl. No.: 10/350,960

(22) Filed: Jan. 27, 2003

(65) Prior Publication Data

US 2003/0151410 A1 Aug. 14, 2003

(30) Foreign Application Priority Data

Jan. 25, 2002 (FR) ........................................... 02 00921

(51) Int. Cl.[7] ......................... G01R 27/08; H01H 1/00; G08B 21/00

(52) U.S. Cl. ....................... 324/713; 324/522; 361/232; 340/654; 340/657

(58) Field of Search ................................ 324/654, 713, 324/509–537; 340/635, 654, 657, 659; 361/232; 307/106

(56) References Cited

U.S. PATENT DOCUMENTS 3,873,847 A * 3/1975 Finch et al. .................. 307/64
4,859,868 A * 8/1989 McKissack ................. 307/106
5,550,530 A * 8/1996 Hamm ........................ 340/564
5,596,281 A * 1/1997 Eriksson ..................... 324/713
5,651,025 A * 7/1997 May ........................... 375/239
5,771,147 A * 6/1998 Eriksson et al. ............ 361/232
6,020,658 A * 2/2000 Woodhead et al. ......... 307/106
6,084,505 A * 7/2000 Walley .................. 340/310.01
2001/0002793 A1 6/2001 Woodhead et al. ......... 324/654

* cited by examiner

*Primary Examiner*—Vincent Q. Nguyen
(74) *Attorney, Agent, or Firm*—Young & Thompson

(57) ABSTRACT

This method of checking at least one operating parameter of an energizer supplying an electric fence with high-voltage shock pulses consists, on the one hand, in producing a measurement signal having a value representing the operating parameter to be checked and controlling the production of the shock pulses as a function of the measurement signal in such a way that a time interval between the shock pulses is a function of the value of the measurement signal, and, on the other hand, in performing the following steps in any zone along the electric fence, remotely from the energizer: picking up the shock pulses; evaluating the time interval between the picked up pulses; and operating an indicator so as to provide an indication about the operating parameters, as a function of the evaluated time interval.

19 Claims, 5 Drawing Sheets

| T | $T_1$ | $T_2$ | $T_3$ | $T_4$ | $T_5$ | $T_6$ | $T_7$ | $T_8$ |
|---|---|---|---|---|---|---|---|---|
| Sortie 65 | 1 continu | 1 continu | 0 | 0 | 1 pulsé | 1 pulsé | 0 | 0 |
| Sortie 66 | 0 | 1 continu | 1 continu | 0 | 0 | 1 pulsé | 1 pulsé | 0 |

METHOD AND DEVICE FOR CHECKING AN OPERATING PARAMETER OF AN ELECTRIC FENCE

FIELD OF THE INVENTION

The present invention relates to a method of checking at least one operating parameter of an energizer supplying high-voltage shock pulses to an electric fence, and also to a device for implementing said method.

In the present text, "operating parameter of the energizer" means a parameter such as:

- the state of charge of a stand-alone power source (primary-cell battery or secondary-cell battery) for supplying direct current to the energizer of the electric fence energizer,
- the maximum voltage, maximum energy, or peak current of the shock pulses at the outlet of the energizer,
- the degree of insulation of the electric fence from the soil, as observed by the energizer at the starting point of the electric fence energizer, or
- the state of an internal memory in the energizer containing one or more values; or indeed
- any other known parameter of the energizer that could be of interest to a user.

BACKGROUND OF THE INVENTION

Electric fence energizers are usually supplied with electric energy by various energy-sources such as primary-cell (non-rechargeable) or secondary-cell (rechargeable) batteries, or the mains. Certain energizers are designed to be able to be fed with electric energy by any of the three above-mentioned energy-sources, at the user's choice.

Where the operating parameter to be checked is the degree of charge of the stand-alone electric-energy source (primary- or secondary-cell battery) for the energizer, the present invention naturally applies only to electric fences whose energizer is fed by such a stand-alone power source. However, where the operating parameter to be checked is one of the other above-mentioned operating parameters of the energizer, the present invention is applicable whatever the energy-source feeding the energizer of the fence.

Portable energizers supplied with electricity by a stand-alone source (primary- or secondary-cell battery) are usually installed in the open field. These energizers generally have a device for checking and giving a visual indication of the state of charge of the primary- or secondary-cell battery feeding them with electric power. French patent FR 2 786 874 describes such a checking and display device. When a push-button is depressed, an indicator with light-emitting diodes (LEDs) displays the state of charge of the primary- or secondary-cell battery, by way of the colour and/or continuous or blinking nature of the light emitted by the indicator. For the user, the disadvantage of such a device lies in the need to go to the place where the energizer is located, which can be at some distance from a road or access way.

Also known in the art is an electronic apparatus for contact-free checking of electric fences, which makes possible to detect, at a distance from the fence, the presence of shock pulses in an electric fence wire (see Swiss patent CH 672 960). Apart from indicating the presence or absence of shock pulses, this checking apparatus provides no other indication to the user, such as, for example, the state of the primary- or secondary-cell battery, or any other parameter characterising the operation of the energizer.

Patent application US 2001/0 002 793 A1 describes a detecting-device which is based on the same principle as the checking apparatus in Swiss patent CH 672 960, but which improves on the latter by making it possible not only to detect at a distance the presence or absence of shock pulses at a given point along an electric fence, but also to provide a quantitative indication of the peak current, voltage, or energy of said pulses at said point on the fence, by giving an audio signal whose frequency is a function of an electric magnitude of said pulses. This known device does not make it possible to provide any indication about any operating parameter of the energizer itself.

New Zealand patent NZ 258 240 describes a method and a control device making it possible to send coded signals along an electric fence line that are distinct from the shock pulses produced by the energizer of the electric fence, so as to control the operating state of said energizer, i.e. switch it on or off.

International application WO 00/22750 describes a process and a system making it possible to transmit control signals, or information, along an electric fence line. The control signals or information, constituted by one or more blocks of data, are transmitted along the fence line in the form of a carrier frequency which is phase-modulated by said control signals or information. The system comprises, on the one hand, one or more transmitters comprising a hand-held, portable remote-control unit, or other device, for connection to the fence-line, to produce and send said control signals or said information, and, on the other hand, one or more receivers for connection to the fence-line, to receive the control signals or information transmitted along the fence-line, and to process said control signals or said information, and/or to display said information. The hand-held portable remote control can itself include such a receiver. Such a system makes it possible to inform a user, at a distance from the energizer of the electric fence, about one or more operating parameters of said fence. However, it is relatively complicated and expensive in terms of equipment, in that the transmitter (or each transmitter) requires means of producing a carrier frequency distinct from the shock pulses, and means for phase-modulating said carrier frequency with the control signals or information; and the receiver (or each receiver) requires means for demodulating the carrier frequency received and recovering the control signals or information.

U.S. Pat. Nos. 5,420,885 and 5,651,025 and European patent EP 0 514 222 describe a method and a device making it possible to transmit a communication signal on an electric fence line. The communication signal is transmitted in the form of coded pulses which arc amplitude-modulated, frequency-modulated, or pulse-position-modulated and which are distinct and separate from the shock pulses produced by the energizer of the electric fence. The coded pulses are produced by a communication device which is either separate from the energizer of the electric fence or included in said energizer. In the latter case, the minimum supplementary components necessary for the communication device, in addition to the components already included in the energizer, are a second energy storage device, such as a capacitor, and a controllable switching-device such as a thyristor, which causes charging or discharging of the capacitor in the electric fence system depending on whether the thyristor is on (i.e. in a conductive state) or off. The very existence of coded communication-pulses distinct from the shock pulses can pose problems with regard to compliance with the safety standards applying to electric fence energizers. In addition, the need for supplementary components to produce the coded pulses increases the cost.

SUMMARY OF THE INVENTION

The present invention aims to economically provide the user with information on at least one operating parameter of an electric fence energizer, solely on the basis of the shock pulses that it produces, that is to say, without it being necessary to transmit a coded signal, distinct from the shock pulses produced by the electric fence energizer, or without it being necessary to transmit a carrier frequency phase-modulated by an information signal, and hence without it being necessary to add supplementary components to the electric fence energizer.

Thus, the subject-matter of the present invention is, broadly, a method for checking at least one operating parameter of an energizer supplying an electric fence with high-voltage shock pulses, characterized by the following steps:

a) the production of at least one measurement-signal having a value representing the operating parameter to be checked;

b) the controlling of the production of the shock pulses as a function of said measurement-signal in such a way that the time interval between said shock pulses is a function of the value of said measurement-signal; and, c) in any zone along said electric fence, remotely from the energizer: the picking-up of said shock pulses; determination of the time interval between the pulses picked up; and operation of an indicator, as a function of the time interval determined, so as to provide an indication about said operating parameter.

The method according to the invention can also have one or more of the following characteristics:

In a first form of embodiment of the invention, in which the electric fence energizer is able to produce a succession of single shock pulses having a repetition time, said time interval is the repetition time of said shock pulses.

In this first form of embodiment of the invention, the method can consist in the following:

in step a), the production of n measurement-signals, n being an integer greater than 1, whose values correspond respectively to n operating parameters to be checked; and, in step b), the production, cyclically, of n successive sequences of shock pulses in such a way that in each sequence the shock pulses have a repetition time whose value is a function, respectively, of the value of one of the n measurement-signals and lies in one of n different time ranges, each time range corresponding to one of the n operating parameters; and, in step c), the picking-up of at least one of the n successive sequences of shock pulses; evaluation of the repetition time of the shock pulses of the detected sequence; and determination of the time range in which the evaluated repetition time lies, so as to provide an indication about the corresponding operating parameter.

In a second form of embodiment of the invention, in which the electric fence energizer is capable of producing a succession of complex shock pulses, each complex shock pulse being formed by a train of at least two successive, relatively close, elementary pulses, with the pulse trains having a repetition time substantially greater than the total duration of each pulse train, said time interval is at least one of the following: said repetition time of said pulse trains, and the time interval between two successive elementary pulses of each pulse train.

In this second form of embodiment of the invention, the method can consist in the following:

in step a), production of n measurement signals, n being an integer greater than 1, whose values correspond respectively to n operating parameters to be checked;

in step b), controlling the production of said complex shock pulses so that the repetition time of the pulse trains has a value that is a function of at least one of the n measurement signals, and so that the time interval between at least two successive elementary pulses of each pulse train has a value that is a function of at least one other of the n measurement signals; and, in step c), evaluating said repetition time of the pulse trains and said time interval between at least two successive elementary pulses of each pulse train, so as to provide indications about the corresponding operating parameters.

In the first and second forms of embodiment, in step c), pickup is effected without electric contact being made with the electric fence.

Said operating parameter or parameters is/are selected from the group comprising: the state of charge of a stand-alone de power supply to said energizer, the maximum voltage, maximum energy, and peak current of said shock pulses at the output of the energizer, the degree of insulation of the electric fence as observed by the energizer at the starting point of the electric fence, the state of an internal memory in the energizer containing one or more values, and any other known parameter of the energizer that could be of interest to a user.

The value of the time interval of said shock pulses is a monotonic function of the value of said measurement signal.

The value of the time interval of said shock pulses is a discontinuous, stepped function.

Further subject-matter of the present invention is: a device for checking at least one operating parameter of an energizer supplying an electric fence with shock pulses, wherein it comprises:

a) at least one measuring means able to produce a measurement signal having a value representing the operating parameter to be checked;

b) a control means suitable for controlling the production of shock pulses as a function of said measurement signal, in such a way that the time interval between said shock pulses is a function of the value of said measurement signal;

c) a pick-up means suitable for picking up said shock pulses in any zone along said electric fence;

d) an indicating means; and e) evaluating means suitable for determining the time interval between the pulses picked up, and for operating said indicating means, as a function of the time interval determined, so as to provide an indication about said operating parameter.

The checking-device of the invention can also have one or more of the following characteristics:

in the case of an energizer comprising a microcontroller and in which each shock pulse is produced in response to the triggering of an electronic switch;

said control means is constituted by said microcontroller, which is programmed or programmable to send triggering pulses to said electronic switch at a rate that is a function of the value of said measurement signal.

in the case of an electric fence energizer comprising at least two electronic switches controlled by a microcontroller in such a way that the electric fence energizer is able to produce a succession of complex shock pulses, each complex shock pulse being formed by a train of at least two successive elementary pulses relatively close to one another, each pulse in the pulse train being produced in response to the triggering of a respective electronic switch, and the pulse trains having a repetition time substantially greater than the total duration of each pulse train, said control means is constituted by said microcontroller, which is programmed or programmable to send triggering pulses to at least one of said electronic switches at a rate that is a function of the value of said measurement signal;

the pick-up means, the indicating means, and the evaluating means are installed in a portable housing that is independent of the energizer;

the pick-up means comprises an antenna;

the antenna is connected by a shaping circuit to the evaluating means;

the evaluating means comprise a second microcontroller, which is programmed or programmable and which is associated with a clock; and the indicating means is an element of the group comprising: a light-emitting indicator with at least one light-emitting diode, a liquid crystal display, a bar graph, and an audio indicator.

Further subject-matter of the present invention is: an intermediate product, namely an electric fence energizer implementing a first part of the method of the invention, comprising:

a) a generator of high-voltage shock pulses, to be connected to an electric fence; and b) at least one measuring means able to produce a measurement signal having a value representing an operating parameter of the energizer;

wherein it comprises, in addition, a control means connected to the measuring means and to the shock pulse generator, to control said shock pulse generator in such a way that the time interval between said shock pulses is a function of the value of said measurement signal.

Further subject-matter of the present invention is: another intermediate product, namely a checking apparatus implementing a second part of the method of the invention, comprising:

a) a pick-up means capable of picking up said shock pulses in any zone along said electric fence; and b) an indicating means;

wherein it comprises, in addition, c) evaluating means able to determine the time interval between the shock pulses picked up, and to operate said indicating means, as a function of the time interval determined, so as to provide an indication about said operating parameter.

BRIEF DESCRIPTION OF THE DRAWINGS

Other characteristics and advantages of the invention will emerge better in the course of the following description of one form of embodiment, which is given by way of example, and which refers to the attached drawings, in which.

DETAILED DESCRIPTION OF THE INVENTION

Figure 1:
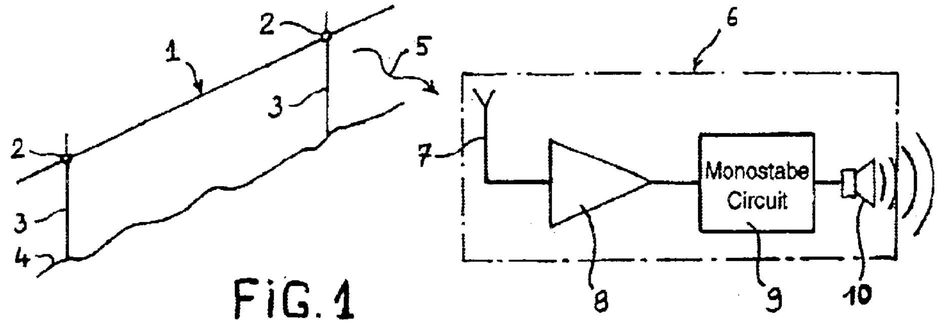
FiG. 1 PRIOR ART
FIG. 1 illustrates, diagrammatically, the operating principle of a device known in the art, for the remote detection of shock pulses at a given point along an electric fence.

Referring first to FIG. 1, this shows part of an electric fence line 1, borne by insulators 2, which themselves are supported by stakes 3 stuck into the ground 4. The electric fence line 1 is fed with shock pulses by an energizer (not shown in FIG. 1). The shock pulses supplied by the energizer usually have a constant repetition time, generally greater than 1 second—between 1 and 2 seconds, for example. At each pulse supplied by the energizer, a pulsed electromagnetic wave 5 is radiated into space by the electric fence line 1. The electromagnetic wave 5 can be picked up by an electronic detection apparatus 6 placed at any point along the fence line 1. The detection apparatus 6 comprises a receiving antenna 7 suitable for picking up the electric component or the magnetic component of the electromagnetic wave 5. The voltage generated in the antenna 7 by the electromagnetic wave 5 is shaped by an amplifier 8 whose output signal triggers a monostable circuit 9. The output pulse of the monostable circuit 9 has an amplitude and duration sufficient to activate an audio alarm 10 and/or a light-emitting indicator such as a light-emitting diode (LED), or any other indicating means suitable for alerting the user to the presence of electromagnetic waves 5, and hence shock pulses on the electric fence wire 1.

Figure 2:
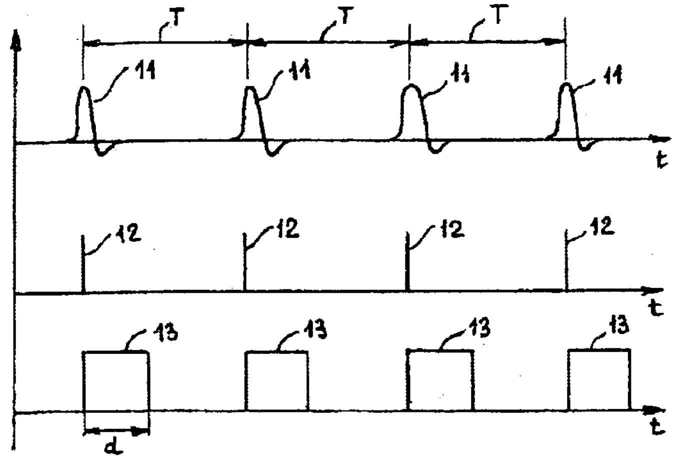
FiG. 2 PRIOR ART
FIG. 2 shows the general course of the electric signals, and their time relationship, in the detection-device known in the art, shown in FIG. 1.

FIG. 2 shows the voltage pulses 11 produced in the antenna 7. The voltage pulses 11 are produced in time with the shock pulses on the electric fence wire 1, i.e. the pulses 11 have the same repetition time T as said shock pulses. After shaping of the pulses 11 by the amplifier 8, calibrated pulses 12 are obtained, which serve to trigger the monostable circuit 9. In response to each pulse 12, the monostable circuit 9 supplies a rectangular pulse 13, of duration d, which activates the alarm 10. As the pulses 11, 12, and 13 have a repetition time T equal to that of the shock pulses present on the fence line 1, the alarm 10 will thus emit audio beeps and/or, such being the case, flashes of light, in time with the shock pulses present on the electric fence line 1. Such a checking device, known from the above-mentioned patent CH 672 960, merely makes it possible to indicate whether shock pulses are present on or absent from on the electric fence line 1.

Figure 3:
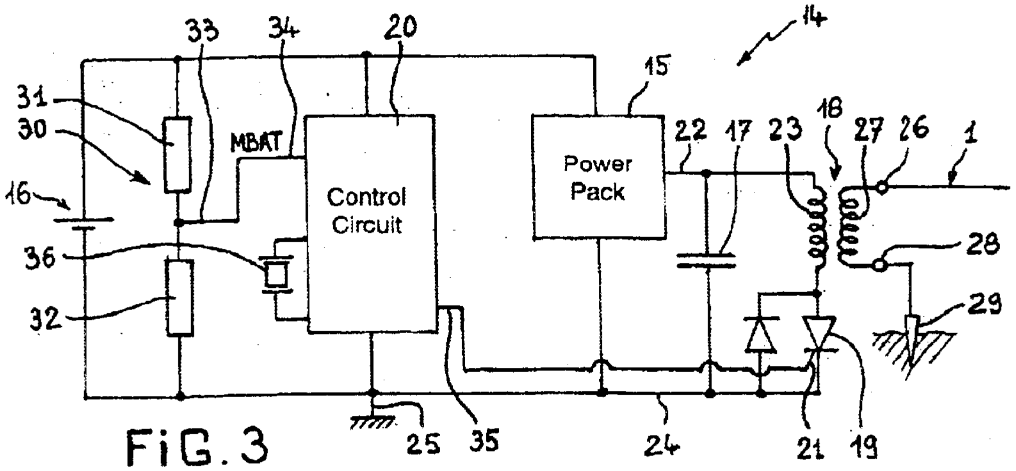
FIG. 3 is a simplified diagram of an electric fence energizer implementing a first part of the method of the invention, in the case where the operating parameter that is to be checked is the state of charge of a stand-alone power-source feeding the energizer.

Referring now to FIG. 3, this shows an electric fence energizer 14 that implements part of the checking-method according to the invention. The energizer 14 comprises, in the normal way, a power pack 15 that is connected or connectable to a primary source of electric energy (primary- or secondary-cell battery, or mains), an energy storage capacitor 17, a transformer 18, an electronic switch 19, e.g. a thyristor, and a control circuit 20 connected to the gate 21 of the thyristor 19. The output 22 of the power pack 15 is connected, on the one hand, to one of the electrodes of the capacitor 17, and, on the other hand, to one of the terminals of the primary winding 23 of the transformer 18, the other terminal of which is connected, via the thyristor 19, to the common line 24, which latter is connected to earth (ground) 25. The other electrode of the capacitor 17 is likewise connected to earth 25 by the common line 24. One output terminal 26 of the secondary winding 27 of the transformer 18 is connected to one end of the electric fence line 1, while the other output terminal 28 of the secondary winding 27 is connected to an earth connection 29.

Normally, when the energizer 14 is in service, the capacitor 17 is charged by the power pack 15, and discharged periodically through the primary winding 23 of the transformer 18 by the turning on of the thyristor 19 (causing it to conduct) through the action of periodic triggering pulses applied to its gate 21 by the control circuit 20. This results in shock pulses at the terminals of the secondary winding 27 and consequently in the fence line 1. The repetition time of these shock pulses is equal to that of the triggering pulses applied to the gate 21 of the thyristor 19 by the control circuit 20.

Where the primary source of electric energy 16 is a stand-alone voltage-source such as a primary- or secondary-cell battery as shown in FIG. 3, and where the operating parameter to be checked is the state of charge of the primary- or secondary-cell battery 16, the present invention provides that the time interval between, or repetition time of, the shock pulses produced by the energizer 14 shall depend on said state of charge.

For this purpose, the energizer 14 comprises, in addition, a measuring circuit 30 for producing a measurement signal MBAT, the value of which represents the voltage at the terminals of the primary- or secondary-cell battery 16 and hence the state of charge of said battery, and which is sent to the control circuit 20. The measuring circuit 30 can be constituted, for example, by a divider bridge constituted by two resistors 31 and 32, connected in parallel to the primary- or secondary-cell battery 16. The intermediate tapping of the divider bridge 30 (constituted by the resistors 3 1, 32) is connected to an input terminal 34 of the control circuit 20. This control circuit 20 is designed, as will be seen later, to supply triggering pulses at its output 35, which is connected to the gate 21 of the thyristor 19; said triggering pulses have a repetition time whose value is a function of the value of the measurement signal MBAT received at input 34.

Modem electric fence energizers normally comprise a programmed or programmable, digital, integrated electronic circuit of the microcontroller type, which is used to perform various functions. This integrated circuit or microcontroller normally has multiple input/output pins, certain of which accept analogue signals, which are transformed into digital values by an internal analogue-digital converter in the microcontroller. Such a microcontroller can be provided in the energizer 14 according to the invention, to perform the function of the control circuit 20 of the energizer 14—possibly in addition to its normal functions.

In this case, dedicated software stored in a memory of the microcontroller 20 performs the following operations:

reading the voltage (measurement signal MBAT) present at input 34;

calculating a value for the time interval between the triggering pulses that are to be applied to the gate 21 of the thyristor 19 and hence between the shock pulses that will be produced by the energizer 14, as a function of the voltage read at the input 34 (which can be a calculation based on a mathematical formula, or can consist in looking up a time value in a table stored in the microcontroller 20); and triggering the thyristor 19 by applying a pulse to its gate 21, by activating the output 35 of the microcontroller 20 at the timing determined by the above-mentioned calculation.

Triggering the thyristor 19 is performed at extremely precise time intervals because the microcontroller 20 has a time reference (clock), generally controlled by a crystal 36 or similar device.

In one form of implementation of the present invention, it is possible to assign, to each voltage range occurring during the discharge of the primary-cell or secondary-cell battery 16, a precise value for the interval of time between the triggering pulses applied to the gate 21 of the thyristor 19, and hence for the repetition time T of the shock pulses supplied by the energizer 14.

Preferably, although this is not compulsory for the invention, the software included in the microcontroller 20 is designed to increase the interval of time between the triggering pulses, and hence the repetition time T of the shock pulses, when the voltage of the battery decreases. This makes it possible to increase the duration of operation of the energizer 14 when the voltage of the battery decreases, by reducing the mean consumption of the energizer 14.

Figure 4:
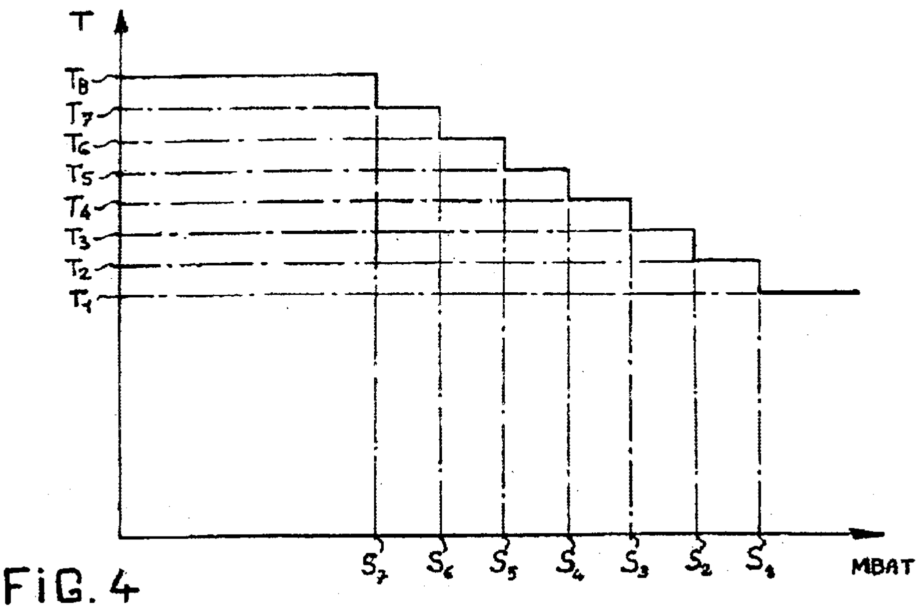
FIG. 4 is a graph showing the relationship between a measurement signal representing the output voltage of the stand-alone power supply and the repetition time of the shock pulses produced by the energizer shown in FIG. 3.

For example, as indicated in FIG. 4, seven voltage thresholds $S_1$ to $S_7$ can be provided, corresponding to eight values $T_1$ to $T_8$ for the repetition time T of the shock pulses. By way of example, the following table indicates, for an energizer 14 fed by a 12 volt secondary-cell battery or a 9 volt primary-cell battery, the battery's voltage values corresponding to voltage-thresholds $S_1$ to $S_7$, and the corresponding values of $T_1$ to $T_8$.

| $S_1$ | $S_2$ | $S_3$ | $S_4$ | $S_5$ | $S_6$ | $S_7$ | |
|---|---|---|---|---|---|---|---|
| 12 V | 11 V | 10 V | 9.5 V | 9 V | 8 V | 7 V | |
| $T_1$ | $T_2$ | $T_3$ | $T_4$ | $T_5$ | $T_6$ | $T_7$ | $T_8$ |
| 1.33 s | 1.36 s | 1.39 s | 1.42 s | 1.45 s | 1.48 s | 1.51 s | 1.54 s |

Figure 5:
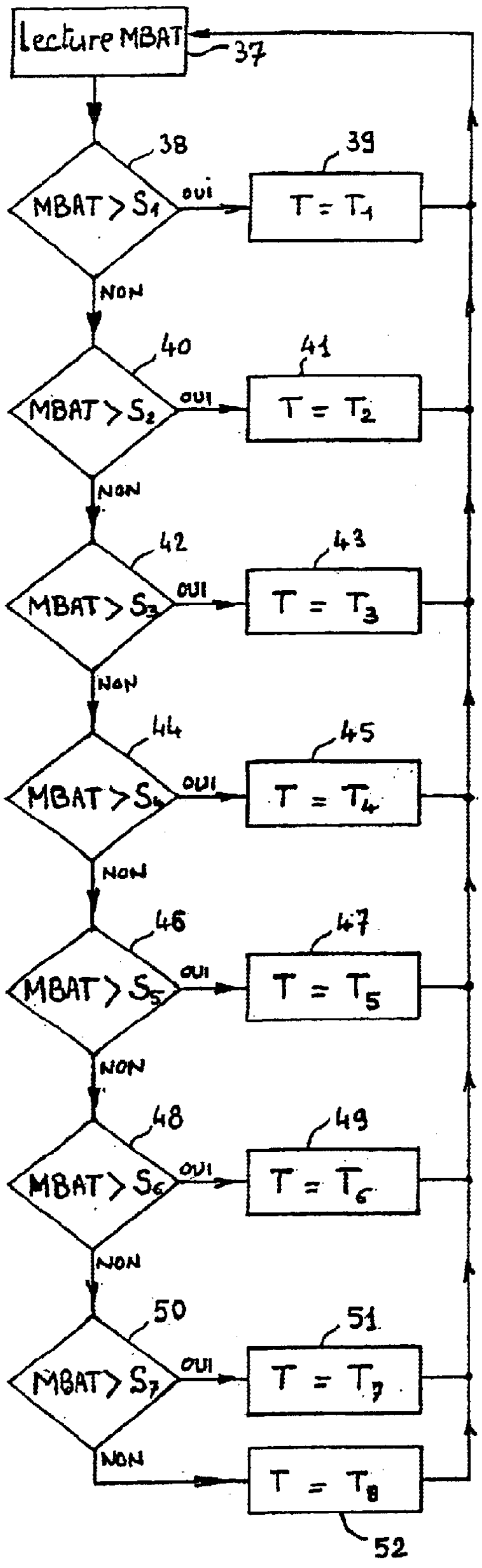
FIG. 5 is a logic diagram of the functioning of the energizer in FIG. 3.

FIG. 5 shows the logic diagram for the operations performed by the software included in the microcontroller 20. The first operation 37 consists in reading the measurement signal MBAT present at input 34. The second operation 38 consists in testing whether the measurement signal has a value greater than threshold $S_1$. If that is the case, the software passes to operation 39, which sets the repetition time for the triggering pulses applied to the gate 21 of the thyristor 19, and hence the repetition time T of the shock pulses produced by the energizer 14, to the value $T_1$, and the software then returns to operation 37. Operations 37, 38, and 39 are repeated cyclically until the value of the measurement signal ceases to be greater than threshold $S_1$.

In the contrary case, the software passes to operation 40, which tests whether the value of the measurement signal MBAT is greater than threshold $S_2$. If that is the case, the software passes to operation 41, which sets time T to the value $T_2$, and the software then returns to operation 37. Operations 37, 38, 40, and 41 are then repeated cyclically until the value of the measurement signal ceases to be greater than threshold $S_2$.

Similarly, as the primary-cell or secondary-cell battery progressively discharges, the software successively tests whether the value of the measurement signal MBAT is greater than thresholds $S_3$, $S_4$, $S_5$, $S_6$, and $S_7$ (operations 42, 44, 46, 48, and 50) and, accordingly, sets time T to the value $T_3$, $T_4$, $T_5$, $T_6$, or $T_7$ (operations 43, 45, 47, 49, or 51). Finally, if the value of the measurement signal is less than threshold $S_7$, the software sets time T to the value $T_8$ (operation 52), and operations 37, 38, 40, 42, 44, 46, 48, 50, and 52 are repeated cyclically while the value of the measurement signal remains less than threshold $S_7$.

Figure 6:
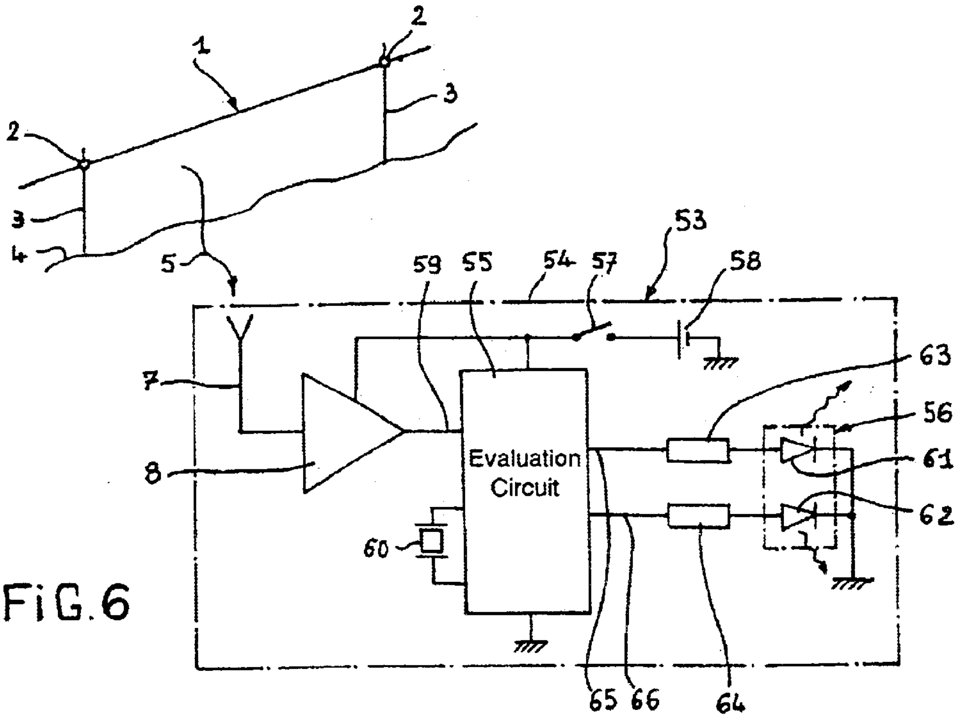
FIG. 6 is a simplified diagram of an apparatus for the remote checking of the state of charge of the primary- or secondary-cell battery of the energizer in FIG. 3, implementing a second part of the method of the invention.

Referring now to FIG. 6, this shows a checking apparatus 53 implementing a second part of the method of the invention. In FIG. 6, the elements which arc similar to those in FIG. 1, or which perform the same function, are given the same reference numbers, and will not be described again in detail. The checking apparatus 53 comprises, in a housing 54, an antenna 7 connected to the input of an amplifier 8, whose output is connected to an evaluation circuit 55 connected to an indicating device 56. The checking apparatus 53 comprises also a switch 57, and a dry cell 58 enabling the amplifier 8 of the evaluation circuit 55, and the indicating-device 56, to operate when the switch 57 is closed.

Here too, as in the checking apparatus 6 in FIG. 1, the voltage pulses 11 (FIG. 7), which arc produced in the antenna 7 of the checking apparatus 53 by the electromagnetic waves 5 radiated by the electric fence line 1 and which have a repetition time equal to that of the shock pulses present on said fence line, are shaped by the amplifier 8, and supplied in the form of calibrated pulses 12, having the same repetition time as the voltage pulses 11, to an input 59 of the evaluation circuit 55. This circuit 55 is designed to evaluate the repetition time of the pulses 12 received at its input 59, and to operate the indicating-device 56 as a function of the value of the repetition time of the pulses 12. Circuit 55 can be constituted by, for example, a programmed or programmable integrated electronic circuit of the microcontroller type, containing dedicated software. The microcontroller 55 also contains a clock or accurate internal time reference, controlled by a crystal 60 or other similar device. It will thus be readily understood that the microcontroller 55, with its internal clock and dedicated software, is capable of measuring the interval of time between two successive pulses 12 at its input 59, and hence the interval of time between two successive shock pulses on the fence line 1.

The indicating-device 56 can be constituted by a light-emitting indicator comprising, for example, two light-emitting diodes 61, 62 which, when energized, are able to emit different colours—for example green and red respectively. The anode of diode 61 is connected, by a resistor 63, to a first output 65 of the microcontroller 55; and the anode of diode 62 is connected, by a resistor 64, to a second output 66 of the microcontroller 55. The cathodes of the two diodes 61, 62 are connected to earth.

When output 65 of the microcontroller 55 is in the high state, the indicator 56 emits a first colour—green for example. When the two outputs 65, 66 of the microcontroller 55 are simultaneously in the high state, the indicator 56 emits a second colour—orange for example, being a mixture of green and red. When output 66 is in the high state, indicator 56 emits a third colour, red for example. When the two outputs 65, 66 are simultaneously in the low state, the indicator 56 is off, emitting no light.

As a function of the value of the time interval between the pulses present at input 59 of the microcontroller 55, the dedicated software contained in the microcontroller sets outputs 65, 66 thereof to the high or low state, so that, according to the particular case, the indicator 56 emits one of the three above-mentioned colours, continuously or blinkingly, or remains off; as will be explained below.

When the electric fence line 1 is fed by the energizer 14 in FIG. 3, which produces shock pulses whose repetition time has a precise value that is a function of the voltage in the primary- or secondary-cell battery 16 feeding the energizer 14, the checking apparatus 53 in FIG. 6 is then capable of supplying the user with an indication as to the state of charge of said battery. For this, it picks up the electromagnetic waves 5 radiated by the fence line 1, evaluates the time interval between the pulses received at input 59 of the microcontroller—and hence the repetition time of said shock pulses—and operates the indicator 56 as a function of the result of said evaluation.

Figures 7, 8:
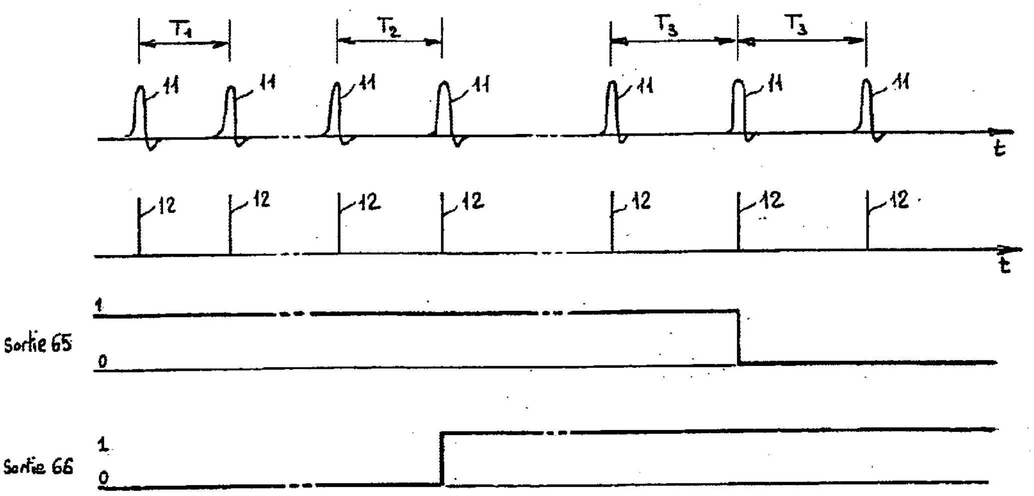
FIG. 7 shows the general course of the electric signals, and their time relationship, in the checking apparatus in FIG. 6.
FIG. 8 shows a correspondence table that can be used in the checking apparatus shown in FIG. 6.

FIG. 8 shows, by way of example, a table indicating the correspondences between, on the one hand, the repetition-time values $T_1$, $T_2$, $T_3$, . . . $T_8$ of the shock pulses present on the fence line 1—and hence of the pulses 12 present at input 59 of the microcontroller 55—and, on the other hand, the states of outputs 65 and 66 of said microcontroller. The states of outputs 65 and 66 are also shown in the diagram in FIG. 7, for values $T_1$, $T_2$, and $T_3$ of the repetition time T. In the diagram in FIG. 7, and in the correspondence table in FIG. 8, the high and low states of outputs 65 and 66 are indicated symbolically by the logical values 1 and 0 respectively. In the case of a continuous state at output 65 or 66 of the microcontroller 55, the corresponding diode 61 or 62 of the indicator 56 will emit a green or red light continuously. In the case of a pulsed state at output 65 or 66, the corresponding diode 61 or 62 will emit a blinking green or red light.

When, therefore, in the embodiment example described above, the microcontroller 55 of the checking apparatus 53 determines that the repetition-time of the shock pulses has the value $T_1$, for example 1.33 seconds, outputs 65 and 66 are set respectively to the state of "1, continuous"0 and "0". In this case, the indicator 56 will continuously emit a green light, indicating a charged secondary-cell battery (voltage greater than 12V). When T has the value $T_2$ (for example, 1.36 seconds), outputs 65 and 66 are set simultaneously to the state "1, continuous", and the indicator 56 emits an orange light continuously, indicating a slightly discharged secondary-cell battery (voltage between 11 and 12V). When T has the value $T_3$ (for example, 1.39 seconds), outputs 65 and 66 are set respectively to "0"and "1, continuous", and the indicator 56 emits a red light continuously, indicating a deeply discharged secondary-cell battery (voltage between 10 and 11V). When T has the value $T_4$ (for example, 1.42 seconds), outputs 65 and 66 are set simultaneously to "0", and the indicator 56 remains off, indicating that it is imperative to recharge the secondary-cell battery (voltage between 9.5 and 10V).

When T has the value $T_5$ (for example, 1.45 seconds), outputs 65 and 66 are set respectively to "1, pulsed" and "0", and the indicator 56 emits a blinking green light, indicating a charged primary-cell battery (voltage greater than 9V). When T has the value $T_6$ (for example, 1.48 seconds), outputs 65 and 66 are set simultaneously to the state "1, pulsed", and the indicator 56 emits a blinking orange light, indicating a slightly discharged primary-cell battery (voltage between 8 and 9V). When T has the value $T_7$ (for example, 1.51 seconds), outputs 65 and 66 are set respectively to "0"and "1, pulsed", and the indicator 56 emits a blinking red light, indicating a deeply discharged primary-cell battery (voltage between 7 and 8V). Finally, when T has the value $T_8$ (for example, 1.54 per seconds), outputs 65 and 66 are set simultaneously to "0", and the indicator 56 remains off, indicating that the primary-cell battery has a voltage of less than 7V and must be replaced.

When the user wishes to check the state of charge of the secondary- or primary-cell battery 16 associated with the energizer 14 connected to the electric fence line 1, he has merely to approach the fence line 1, at any point along it, put the checking apparatus 53 close enough to the fence line to pick up the electromagnetic waves 5 radiated thereby (e.g. a position some metres therefrom), and close the switch 57. The voltage pulses 11 produced in the receiving antenna 7 and shaped by the amplifier 8 are then sent, in the form of calibrated pulses 12, to input 59 of the microcontroller 55 in time with the shock pulses present on the electric fence line 1. The software contained in the microcontroller 55 then performs the following operations (see FIG. 9).

Figure 9:
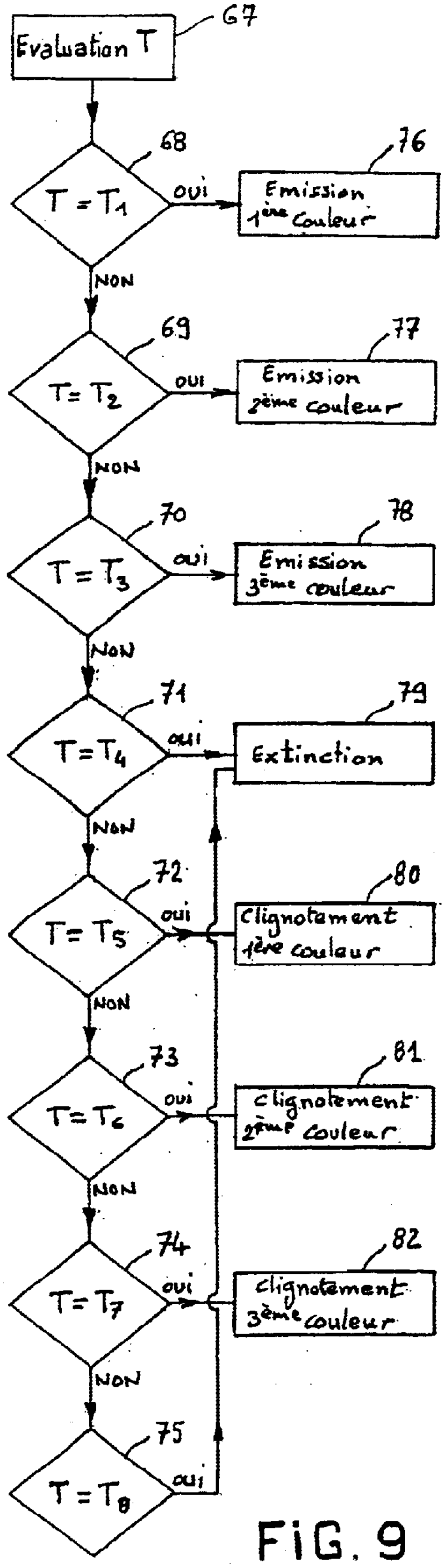
FIG. 9 is a logic diagram showing the functioning of the checking apparatus of FIG. 6.

The first operation 67 consists in evaluating the time interval between the pulses 12 present at input 59 of the microcontroller 55, and hence the repetition time T of the shock pulses on the electric fence line 1. Then, in accordance with the value of repetition time T determined in operation 67, the software goes through all or part of operations 68 to 75, which test the value of repetition time T relative to values $T_1, T_2, T_3, \ldots T_8$ stored in the internal memory of the microcontroller 55. In accordance with the results of these tests, the software ends up at one of the operations labelled 76 to 82, indicating to the user either that the secondary- or primary-cell battery 16 is more or less charged or that it is necessary to recharge the secondary-cell battery or replace the primary-cell battery, assuming that the user knows whether the energizer 14 is provided with a secondary-cell battery or a primary-cell battery. With the embodiment-example described above, the first colour, indicated in blocks 76 and 80 in FIG. 9 is the colour "green"; the second colour, indicated in blocks 77 and 81, is the colour "orange"; and the third colour, indicated in blocks 78 and 82, is the colour "red".

Various modifications can easily be made to the above-described form of embodiment of the invention, by a person skilled in the art. For example, it would be possible for the operations performed by the microcontrollers 20 and 55 to be performed by other standard electronic components such as comparators and/or integrated logic-circuits, but this solution is, in general, less favourable on the economic level.

In addition, it is not absolutely necessary for the shock pulse repetition-time value T set by the microcontroller 20 to be a decreasing function of the value of the measurement signal MBAT applied to input 34 of said microcontroller. In fact, said function could be an increasing function, and, instead of being a discontinuous, stepwise function, could be a continuous function.

In a variant form of embodiment, the light-emitting indicator 56 could be replaced by an indicator with liquid crystals, or by a bar-graph-type display device, an audio indicator, or a combination of at least two of the above-mentioned indicating means.

As another form of embodiment, instead of picking up the electromagnetic waves 5 radiated by the electric fence line 1, it would be possible to directly pick up the shock pulses present on said electric fence line 1. In this case, the receiving antenna 7 of the checking apparatus 53 can be replaced with a testing rod intended to be placed in electrical contact with the electric fence line 1. The testing-rod is connected to the input of the amplifier 8 by way of a voltage-reducing device and preferably also by way of a coupler suitable for ensuring that the testing rod and the amplifier 8 are galvanically isolated from each other. For example, the voltage-reducing device can be constituted by a divider bridge with resistors, and the coupler can be constituted by an optocoupler. As a variant, the voltage-reducing device and the coupler can be constituted by single element such as a voltage-reducing transformer.

In addition, the invention is not limited to checking the state of charge of the secondary- or primary-cell battery feeding the fence energizer. The invention can, in fact, be used to check other operating parameters of an electric fence energizer, for example the maximum voltage, peak current, or maximum energy of the shock pulses at the energizer's output, as observed by the energizer at the starting point of the electric fence, or the state of an internal memory in the energizer that contains one or more values, or indeed any other known parameter of the energizer that could be of interest to a user, whether the energizer is fed by a primary- or secondary-cell battery or whether it is mains-powered (alternative network).

For example, where the parameter to be checked is the maximum voltage of the shock pulses at the output of the energizer, a voltage divider bridge with an appropriate reduction coefficient can be connected in parallel to the primary winding 23 of the transformer 18, with the intermediate tapping of the divider bridge being connected to input 34 of the microcontroller 20—in place of the intermediate tapping 33 of divider bridge 30.

In a more sophisticated version of the checking-method and checking-device of the invention which can be implemented in an electric fence energizer similar to the energizer 14 in FIG. 3 and which comprises a number of measuring means (not shown) each of which is able to produce a measurement signal having a value representing one of the above-mentioned operating parameters, each measuring means can be connected to a respective analogue input of the microcontroller 20 of the energizer 14. It will be noted that if one of the measuring means is such as to produce a measurement signal whose value represents the peak current of the shock pulses, the microcontroller 20 of the energizer 14 can be programmed to also calculate the value of the maximum energy of said shock pulses, calculating said value from the measured value of the peak current, and from the duration of the shock pulses, which is normally known.

In this version of the checking-method and checking-device of the invention, the software contained in the memory of the microcontroller 20 of the energizer 14 can be designed so that the microcontroller 20 produces, cyclically, at output 35 thereof, n successive sequences of triggering pulses for the thyristor 19, n being a number greater than 1, corresponding to the number of measuring means connected to the microcontroller 20 and/or corresponding to the number of operating parameters to be checked. In this case, the energizer 14 will produce, cyclically, n successive sequences $SQ_1$, $SQ_2$, . . . $SQ_n$ of shock pulses I (FIG. 10) at a repetition rate corresponding to that of the triggering pulses.

Figure 10:
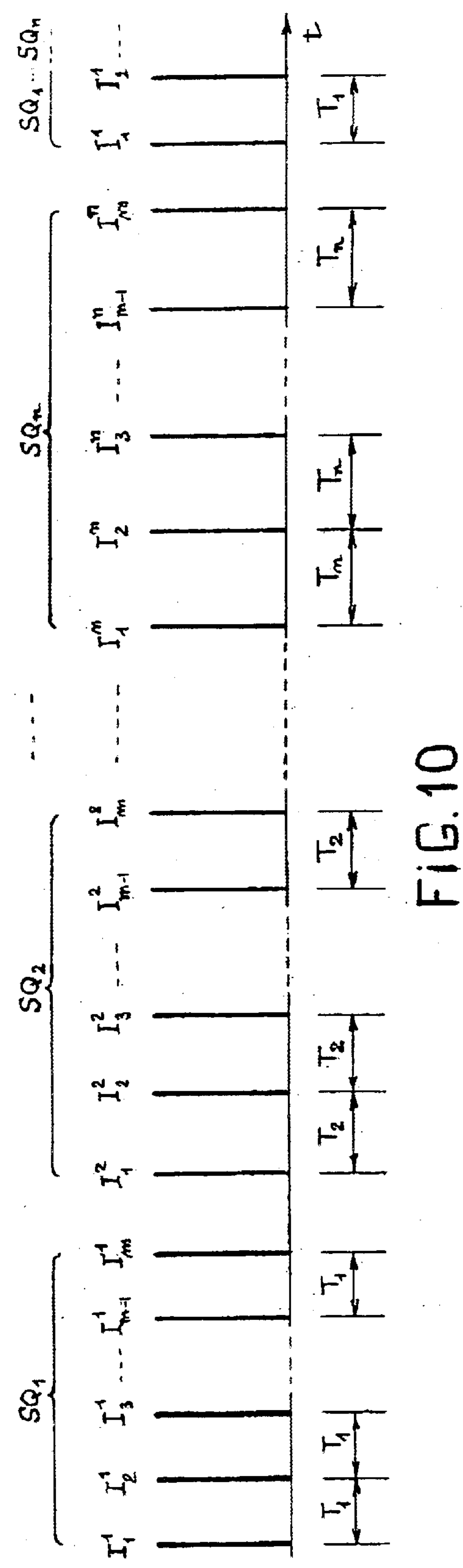
FIG. 10 is a graph showing a time-coding for the shock pulses in the case where there arc a number of operating parameters to be checked.

As shown in FIG. 10, each sequence $SQ_1$, $SQ_2$, . . . $SQ_n$, can comprise m shock pulses I; m being, for example, equal to 5. The pulses of the first sequence $SQ_1$ are designated by $I_1^1$, $I_2^1$, $I_3^1$, . . . $I_m^1$; those of the second sequence $SQ_2$ are designated by $I_1^2$, $I_2^2$, $I_3^2$, . . . $I_m^2$; and those of the last sequence $SQ_n$ are designated by $I_1^n$, $I_{2n}$, $I_3^n$, . . . $I_m^n$.

The first sequence $SQ_1$ corresponds to a first operating parameter, the second sequence $SQ_2$ corresponds to a second operating parameter, and the n-th sequence $SQ_n$ corresponds to the n-th operating parameter. In each sequence $SQ_i$ (i=1, 2 . . . or n), the shock pulses $I_1^i$, $I_2^i$, $I_3^i$I, . . . $I_m^i$ have a repetition time $T_i$ (i=1, 2 . . . or n) whose value depends on the value of the i-th operating parameter and is comprised in an i-th of n different time-ranges, each time range corresponding to one of the n operating parameters to be checked.

For example, if the first operating parameter to be checked is the state of charge of the primary- or secondary-cell battery 16 (FIG. 3), the repetition time $T_1$ of the shock pulses $I_1^1$, $I_2^1$, $I_{31}$, . . . $I_m^1$ of the first sequence $SQ_1$ is regulated by the microcontroller 20 so as to be comprised in a first time range in which $T_1$ can take the stored values $T_1^1$=1.33 seconds, $T_1^2$=1.36 seconds, $T_1^3$=1.39 seconds, . . . $T_1^8$=1.54 seconds, depending on the measured value of the voltage of the primary- or secondary-cell battery 16, in a manner analogous to that described above with regard to FIGS. 4 and 5 (see also the table given above in the description). Similarly, if the second operating parameter to be checked is the maximum voltage of the shock pulses, the repetition time $T_2$ of the shock pulses $I_1^2$, $I_2^2$, $I_3^2$, . . . $I_m^2$ of the second sequence $SQ_2$ is regulated by the microcontroller 20 so as to be comprised in a second time range in which $T_2$ can take, for example, one of the stored values $T_2^1$=1.57 seconds, $T_2^2$=1.60 seconds, $T_2^3$=1.63 seconds, $T_2^4$=1.66 seconds . . . depending on the measured value of the maximum voltage of the shock pulses, and so on for the other operating parameters to be checked.

It will be noted that it is not vital that the stored values for the repetition time $T_i$ be staggered by the same amount (0.03 seconds in the example indicated above) in all the time ranges corresponding respectively to the sequences $SQ_i$, and/or that the number of stored values possible for repetition time $T_i$ in each time range be the same for all the time ranges. In fact, the difference between two possible successive stored values for repetition time $T_i$ and/or the number of possible stored values for time $T_i$ can differ from one time range to the next and will depend in each case on the nature of the operating parameter to be checked and on the desired degree of accuracy for the indication that the user is to be given as to the value of said operating parameter.

In this version of the checking-method and checking-device of the invention, the shock pulses can be picked up by a checking apparatus similar to the checking apparatus 53 in FIG. 6, in a manner similar to that described above. In this case, the software contained in the memory of the microcontroller 55 is designed not only to evaluate the repetition time $T_i$ of the shock pulses picked up, but also to determine the time range in which the evaluated repetition time $T_i$ lies. From the time range thus determined, and the repetition time $T_i$ evaluated, the microcontroller 55 is able to determine—e.g. using a correspondence table contained in its memory—the nature and value of the operating parameter corresponding to the sequence $SQ_i$ of shock pulses being picked up. It is thus able to operate an appropriate indicating means, for example a liquid crystal display, so as to give the user an indication as to the nature and value (qualitative or quantitative) of the corresponding operating parameter, and can do so for each sequence $SQ_i$.

If each sequence comprises, for example, 5 shock pulses (m=5) spaced about 1 to 2 seconds apart, and if the electric fence energizer 14 is designed to check four operating parameters (n=4), it will then only take a maximum of 40 seconds for the checking apparatus 53 to give indications on the four operating parameters.

As regards the displaying of the indications supplied by the checking apparatus, the microcontroller 55 could be programmed to display successively the indications relating to n operating parameters as and when the sequences $SQ_1$, $SQ_2$, . . .$SQ_n$ are picked up. As a variant, if the display-screen comprises a sufficient number of display-lines, it would be possible for the microcomputer 55 to be programmed so as to simultaneously display all the indications relating to the n operating parameters, once n sequences have been picked up. The microcontroller 55 could, if desired, be programmed to retain said indications in memory, e.g. for purposes of comparison with the indications that will be obtained when a subsequent check is performed.

The present invention can also be implemented in an electric fence energizer comprising a number of energy-storing capacitors, and a number of thyristors each mounted in parallel on one of the said capacitors so as to provide individual discharging of each capacitor without modifying the state of charge of the other capacitors. The discharging of the capacitors is actuated in sequence so as to supply the secondary winding of the transformer of the energizer with a succession of complex shock pulses, each complex shock pulse being formed by a train of successive elementary pulses. Each elementary pulse corresponds to the individual discharging of one of the said capacitors. Such an electric fence energizer is described in the document FR 2 787 964. Normally, the trains of elementary pulses have a constant repetition time of at least 1 second, with each train of elementary pulses having a maximum constant duration of about 10–20 ms, and with each elementary pulse in each train having a constant duration of about 0.2 to 0.3 ms.

When the invention is applied to an electric fence energizer capable of producing such a succession of complex shock pulses, the microcontroller of the fence-energizer can be programmed to regulate the repetition time of the elementary-pulse trains and/or the time interval between the two successive elementary pulses in each pulse train as a function of the value of at least one measurement signal representing an operating parameter that is to be checked.

Figure 11:
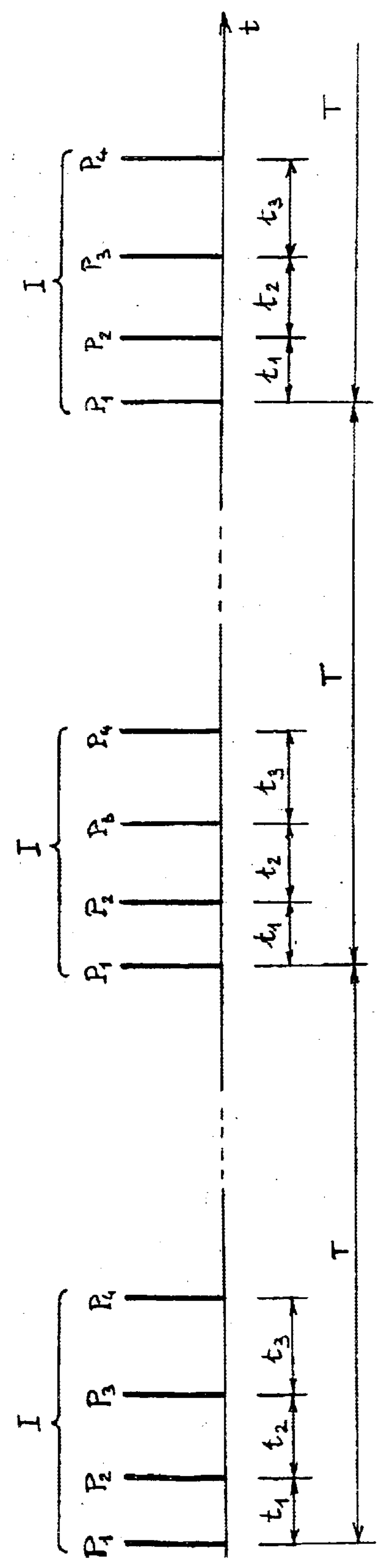
FIG. 11 is a graph showing a time-coding that can be used in the case where the electric fence energizer is able to produce complex shock pulses, each formed by a train of elementary pulses.

For example, if the electric fence energizer comprises four energy-storing capacitors with which four thyristors are respectively associated, the energizer will produce complex shock pulses I (that is to say, trains of elementary pulses) each composed of four elementary pulses $P_1$, $P_2$, $P_3$, $P_4$, as shown in FIG. 11. In this case, four measuring means can be provided, each being able to produce a measurement signal having a value representing one of the four operating parameters to be checked. Each of four measuring means is connected to a respective analogue input of the microcontroller of the energizer. To each analogue input of the microcontroller there is assigned an output of said microcontroller, each of said outputs being connected to the gate of one of the four thyristors.

In these conditions, the software contained in the microcontroller's memory can be designed so that the triggering of the first, second, third, and fourth thyristors, and hence the discharging of the first, second, third, and fourth capacitors of the energizer, is brought about sequentially at moments that are a function of, respectively, the values of the first, second, third, and fourth measurement signals applied respectively to the four analogue inputs of the microcontroller, and hence of the value of the four operating parameters to be checked, e.g. through the use of appropriate correspondence tables recorded in the microcontroller's memory.

For example, as shown in FIG. 11, the first elementary pulses $P_i$ of the complex deterrence-pulses I, and hence the pulse trains, will have a repetition time T that is a function of the value of the first operating parameter; the time interval $t_1$ between the elementary pulses $P_1$ and $P_2$ of each complex pulse I will have a value that is a function of the value of the second operating parameter; the time interval $t_2$ between elementary pulses $P_2$ and $P_3$ will have a value that is a function of the value of the third operating parameter; and the time interval $t_3$ between elementary pulses $P_3$ and $P_4$ will have a value that is a function of the value of the fourth operating parameter.

If the first operating parameter is the state of charge of the primary- or secondary-cell battery powering the energizer, the repetition time T can be regulated so as to take, for example, one of the values 1.33 seconds, 1.36 seconds, 1.39 seconds . . . 1.54 seconds, depending on the measured value of the voltage of the primary- or secondary-cell battery. For the other operating parameters, the time intervals $t_1$, $t_2$, and $t_3$ can be regulated so as to take, for example, values between 0.5 ms and 5 ms, depending on the measured value of the corresponding operating parameters.

The complex shock pulses I can be picked up by a checking apparatus like the checking apparatus 53 in FIG. 6, equipped with an appropriate indicating means such as a liquid crystal display able to give indications as to the nature and value, qualitative or quantitative, of a number of operating parameters. In this case, the software contained in the memory of the microcontroller 55 of the checking apparatus is designed to evaluate the repetition time T of the pulse trains, and the time intervals $t_1$, $t_2$, and $t_3$ of the elementary pulses $P_1$, $P_2$, $P_3$, and $P_4$. From the values of T, $t_1$, $t_2$, and $t_3$, the microcontroller 55 is able, e.g. by means of correspondence tables contained in its memory, to determine the nature and value of the corresponding operating parameters and to operate the display so as to provide indications on said operating parameters to a user.

Although FIG. 11 shows complex shock pulses I, each composed of four elementary pulses $P_1$, $P_2$, $P_3$, and $P_4$, the invention is not limited to this number of elementary pulses. Each complex pulse I can, in fact, be composed of 2, 3, 4, or more elementary pulses, depending on the number of capacitors or thyristors provided in the energizer. If each complex pulse I comprises four or more elementary pulses, then it will, however, in that case, be appropriate to make sure that:

1. The maximum duration of each complex pulse, and hence of each train of elementary pulses, is sufficiently brief, e.g. less than or equal to 20 ms, so that each complex pulse is perceived physiologically by an animal or a human being as a single pulse having a total energy equal to the sum of the individual energies of the elementary pulses forming the complex pulse;
2. The total energy of each complex pulse does not exceed the value permitted by the standards; and
3. The time interval between the last elementary pulse of one complex pulse and the first elementary pulse of the next complex pulse is at least 1 second so as to comply with the safety standards applying to energizers.

What we claim is:

1. The electric fence energizer, comprising:

a) a shock pulses generator, connectable to an electric fence for supplying shock pulses to said electric fence when connected thereto, and b) at least one measuring means for producing a measurement signal having a value representing an operating parameter of the energizer; and wherein a control means is connected to said measuring means and to said shock pulse generator to control said shock pulse generator in such a way that a time interval between said shock pulses generated by said generator is a function of the value of said measurement signal.

2. A checking apparatus for use with the electric fence energizer of claim 1, for checking at least one operating parameter of said electric fence energizer, said checking apparatus comprising:

a) pick-up means for picking up said shock pulses in any zone along said electric fence; and b) indicating means;

wherein said checking apparatus further comprises c) evaluating means for evaluating a time interval between the picked-up shock pulses, and for operating said indicating means as a function of the evaluated time interval, so as to provide an indication about said operating parameter.

3. A method for checking at least one operating parameter of an energizer supplying an electric fence with high-voltage shock pulses, comprising the steps of:

a) producing at least one measurement signal having a value representing the operating parameter to be checked;

b) controlling the production of shock pulses by said energizer as a function of said measurement signal in such a way that a time interval between said shock pulses is a function of the value of said measurement signal; and, c) in any zone along said electric fence, remotely from the energizer: picking-up said shock pulses; evaluating the time interval between the picked up pulses; and operating an indicator, as a function of the evaluated time interval, so as to provide an indication about said operating parameter.

4. The method as claimed in claim 3, wherein the electric fence energizer is able to produce a succession of single shock pulses having a repetition time, and wherein said time interval is the repetition time of said shock pulses.

5. The method as claimed in claim 4, wherein:

step a) comprises the step of;

producing n measurement signals, n being an integer greater than 1, having values corresponding respectively to n operating parameters to be checked;

step b) comprises the step of:

producing cyclically n successive sequences of shock pulses in such a way that in each sequence the shock pulses have a repetition time whose value is a function, respectively, of the value of one of the n measurement signals and lies in one of n different time ranges, each time range corresponding to one of the n operating parameters; and step c) comprises the steps of:

picking-up at least one of the n successive sequences of shock pulses; evaluating the repetition time of the shock pulses of the picked-up sequence; and determing the time range in which the evaluated repetition time lies, so as to provide an indication about the corresponding operating parameter.

6. The method as claimed in claim 3, wherein the electric fence energizer is capable of producing a succession of complex shock pulses, each complex shock pulse being formed by a train of at least two successive, relatively close, elementary pulses, with the pulse trains having a repetition time substantially greater than the total duration of each pulse train, and wherein said time interval is at least one of said repetition time of said pulse trains, and the time interval between two successive elementary pulses of each pulse train.

7. The method as claimed in claim 6, wherein:

step a) comprises the step of:

producing n measurement signals, n being an integer greater than 1, having values corresponding respectively to n operating parameters to be checked;

step b) comprises the step of:

controlling the production of said complex shock pulses so that the repetition time of said pulse trains has a value that is a function of at least one of the n measurement signals, and so that the time interval between at least two successive elementary pulses of each pulse train has a value that is a function of at least one other of the n measurement signals; and, step c) comprises the step of:

evaluating said repetition time of said pulse trains and said time interval between at least two successive elementary pulses of each pulse train, so as to provide indications about the corresponding operating parameters.

8. The method as claimed in claim 3, wherein, in step c), picking up said shock pulses is effected without electric contact being made with the electric fence.

9. The method as claimed in claim 3, wherein said at least one operating parameter is selected from the group comprising: a state of charge of a stand-alone dc power supply to said energizer, a maximum voltage, maximum energy, and peak current of said shock pulses at the output of said energizer, a degree of insulation of said electric fence as observed by said energizer at the starting point of the electric fence, a state of an internal memory containing one or more values, and any other known parameter of said energizer that could be of interest to a user.

10. The method as claimed in claim 3, wherein said time interval of said shock pulses has a value which is a monotonic function of the value of said measurement signal.

11. The method as claimed in claim 3, wherein said time interval of said shock pulses has a value which is a discontinuous, stepped function of the value of said measurement signal.

12. A device for checking at least one operating parameter of an energizer supplying an electric fence with shock pulses, comprising:

a) at least one measuring means for producing a measurement signal having a value representing an operating parameter to be checked;

b) control means for controlling the production of shock pulses by said energizer as a function of said measurement signal, in such a way that a time interval between said shock pulses is a function of the value of said measurement signal;

c) pick-up means for picking up said shock pulses in any zone along said electric fence;

d) indicating means; and e) evaluating means for evaluating the time interval between the picked up pulses, and for operating said indicating means, as a function of the evaluated time interval, so as to provide an indication about said operating parameter.

13. The device as claimed in claim 12, for an energizer comprising a microcontroller and an electric switch which can be triggered by triggering pulses produced by said microcontroller, each shock pulse being produced in response to the triggering of said electronic switch, wherein said control means is constituted by said microcontroller, which is programmed or programmable to send triggering pulses to said electronic switch at a rate that is a function of the value of said measurement signal.

14. The device as claimed in claim 12, for an electric fence energizer comprising at least two electronic switches controlled by a microcontroller in such a way that the electric fence energizer is able to produce a succession of complex shock pulses, each complex shock pulse being formed by a train of at least two successive elementary pulses relatively close to one another, each pulse in the pulse train being produced in response to triggering a respective one of said electronic switches, and the pulse trains having a repetition time substantially greater than the total duration of each pulse train, wherein said control means is constituted by said microcontroller, which is programmed or programmable to send triggering pulses to at least one of said electronic switches at a rate that is a function of the value of said measurement signal.

15. The device as claimed in claim 12, wherein said pick-up means, said indicating means, and said evaluating means are installed in a portable housing that is independent of the energizer.

16. The device as claimed in claim 15, wherein said pick-up means comprises an antenna.

17. The device as claimed in claim 16, wherein said antenna is connected by a shaping circuit to said evaluating means.

18. The device as claimed in claim 12, wherein said evaluating means comprise a second microcontroller, which is programmed or programmable and which is associated with a clock.

19. The device as claimed in claim 12, wherein said indicating means is an element selected from the group comprising: a light-emitting indicator with at least one light-emitting diode, a liquid crystal display, a bar graph, and an audio indicator.

* * * * *